(12) United States Patent
Gratrix

(10) Patent No.: US 10,790,181 B2
(45) Date of Patent: Sep. 29, 2020

(54) WAFER CHUCK FEATURING REDUCED FRICTION SUPPORT SURFACE

(71) Applicant: M Cubed Technologies, Inc., Newtown, CT (US)

(72) Inventor: Edward J. Gratrix, Monroe, CT (US)

(73) Assignee: M Cubed Technologies, Inc., Newtown, CT (US)

( * ) Notice: Subject to any disclaimer, the term of this patent is extended or adjusted under 35 U.S.C. 154(b) by 60 days.

(21) Appl. No.: 15/567,935

(22) PCT Filed: Aug. 10, 2016

(86) PCT No.: PCT/US2016/046436
§ 371 (c)(1),
(2) Date: Oct. 19, 2017

(87) PCT Pub. No.: WO2017/030873
PCT Pub. Date: Feb. 23, 2017

(65) Prior Publication Data
US 2018/0122684 A1    May 3, 2018

Related U.S. Application Data

(60) Provisional application No. 62/205,425, filed on Aug. 14, 2015.

(51) Int. Cl.
*H01L 21/687* (2006.01)
*B24B 37/14* (2012.01)
(Continued)

(52) U.S. Cl.
CPC ........ *H01L 21/68735* (2013.01); *B24B 37/14* (2013.01); *B24B 37/16* (2013.01);
(Continued)

(58) Field of Classification Search
CPC ..... Y10T 279/11; Y10T 279/23; B23B 31/28; B23B 31/307; H01L 21/68735;
(Continued)

(56) References Cited

U.S. PATENT DOCUMENTS 4,551,192 A    11/1985  Dimilia et al.
4,692,836 A *   9/1987  Suzuki ............... H01L 21/6831
                                              279/128

(Continued)

FOREIGN PATENT DOCUMENTS

DE       10085092 B4    8/2007
EP      0 134 438 B1    4/1992
(Continued)

OTHER PUBLICATIONS

International Search Report dated Jan. 10, 2017 for International Application No. PCT/US2016/046436.
(Continued)

*Primary Examiner* — Eric A. Gates
*Assistant Examiner* — Chwen-Wei Su
(74) *Attorney, Agent, or Firm* — Blank Rome LLP

(57) ABSTRACT

Grinding, lapping and polishing basically work by making scratches in the body being ground, lapped or polished. The scratches typically are linear. The scratches gives rise to a directionality component of friction: the friction coefficient is less in the direction along the scratch than in a direction orthogonal, or across, the scratch. In a wafer handling/chucking situation, one wants the wafer to settle on the chuck, which involves the outer regions of the wafer moving radially with respect to the chuck. One can reduce friction in the radial direction by giving the lapping scratches a preferred orientation, namely, radial. This can be achieved by making the final passes of the lapping tool move predominantly in radial directions.

10 Claims, 12 Drawing Sheets

(51) Int. Cl.
*B24B 37/16* (2012.01)
*B24B 37/30* (2012.01)
*G03F 7/20* (2006.01)
*B23B 31/28* (2006.01)
*B23B 31/30* (2006.01)

(52) U.S. Cl.
CPC .............. *B24B 37/30* (2013.01); *G03F 7/707* (2013.01); *H01L 21/6875* (2013.01); *H01L 21/68757* (2013.01); *B23B 31/28* (2013.01); *B23B 31/307* (2013.01)

(58) Field of Classification Search
CPC ........... H01L 21/6875; H01L 21/68742; H01L 21/68757; G03F 7/707; B24B 37/30; B24B 37/14; B24B 37/16
See application file for complete search history.

(56) References Cited

U.S. PATENT DOCUMENTS

| | | | |
|---|---|---|---|
| 5,342,068 A | 8/1994 | Large et al. | |
| 5,692,873 A | 12/1997 | Weeks et al. | |
| 6,063,202 A * | 5/2000 | Cleary | C23C 16/45521 118/500 |
| 6,179,695 B1 | 1/2001 | Takahashi et al. | |
| 6,215,642 B1 | 4/2001 | Sogard | |
| 6,217,655 B1 | 4/2001 | Kumar et al. | |
| 6,264,467 B1 * | 7/2001 | Lue | C23C 16/4581 211/41.18 |
| 6,353,271 B1 | 3/2002 | Williams | |
| 6,717,159 B2 | 4/2004 | Novak | |
| 6,741,447 B2 | 5/2004 | Lee | |
| 7,425,838 B2 | 9/2008 | Itakura et al. | |
| 7,654,887 B2 * | 2/2010 | Ishikawa | B24B 37/30 451/388 |
| 7,722,441 B2 * | 5/2010 | Goela | C23C 16/345 428/848.1 |
| 8,057,633 B2 * | 11/2011 | Tsukamoto | H01L 21/6875 118/723 ER |
| 9,108,292 B2 | 8/2015 | Shimano et al. | |
| 9,233,455 B2 | 1/2016 | Ooi | |
| 9,798,253 B2 * | 10/2017 | Van Sommeren | H01L 21/67028 |
| 2002/0036373 A1 | 3/2002 | Kosakai | |
| 2002/0181184 A1 | 12/2002 | Lee | |
| 2004/0178553 A1 | 9/2004 | Camm et al. | |
| 2006/0079162 A1 | 4/2006 | Yamashita et al. | |
| 2007/0049168 A1 | 3/2007 | Fujita | |
| 2008/0100812 A1 | 5/2008 | Poon et al. | |
| 2010/0190414 A1 | 7/2010 | Harada et al. | |
| 2010/0214549 A1 | 8/2010 | Cadee et al. | |
| 2012/0139192 A1 | 6/2012 | Ooi | |
| 2014/0184003 A1 | 7/2014 | Kiesewetter et al. | |
| 2014/0300064 A1 | 10/2014 | Inaba et al. | |
| 2014/0301818 A1 * | 10/2014 | Gilchrist | H01L 21/67742 414/744.2 |
| 2016/0074986 A1 | 3/2016 | Kato | |
| 2016/0276203 A1 | 9/2016 | Gratrix | |

FOREIGN PATENT DOCUMENTS

| | | | |
|---|---|---|---|
| EP | 1 291 910 B1 | 1/2007 | |
| JP | H07/171747 | 7/1995 | |
| JP | H0936070 A | 2/1997 | |
| JP | 2008/166616 | 7/2008 | |
| JP | 2008300775 A | 12/2008 | |
| JP | 2010/153407 | 7/2010 | |
| JP | 2014103359 A | 6/2014 | |
| JP | 2014128877 A | 7/2014 | |
| WO | WO-2007145505 A1 * | 12/2007 | ....... H01L 21/68757 |
| WO | WO 2011/002881 | 1/2011 | |
| WO | WO 2013/113568 | 8/2013 | |
| WO | WO 2013/113569 | 8/2013 | |

OTHER PUBLICATIONS

International Search Report dated Apr. 12, 2016 for International Application No. PCT/US2015/062231.
Marcin Golabczak, "Polishing of Hard Semiconductor Materials Made of Silicon Carbide", *Mechanics and Mechanical Engineering*, Technical University of Lodz, Lodz, Poland, vol. 15, No. 1, (2011).
Eric W. Weisstein, *CRC Concise Encyclopedia of Mathematics*, pp. 46 and 1184, CRC Press 1999.

* cited by examiner

WAFER CHUCK FEATURING REDUCED FRICTION SUPPORT SURFACE

CROSS-REFERENCE TO RELATED APPLICATION(S)

This patent document claims the benefit of U.S. Provisional Patent Application No. 62/205,425, entitled "Wafer chuck featuring reduced friction support surface for enhanced wafer settling thereon", filed on Aug. 14, 2015 in the name of inventors Edward Gratrix et al. Where permitted, the entire contents of this provisional patent application are incorporated by reference herein.

STATEMENT REGARDING U.S. FEDERALLY SPONSORED RESEARCH

None.

TECHNICAL FIELD

The present invention relates to a method for processing a chuck that handles semiconductor wafers, and a chuck prepared or resulting from such a method. The processed chuck features reduced friction between itself and the wafer, permitting the wafer to settle to a "flat" condition.

BACKGROUND ART

As Moore's Law pushes semiconductor feature sizes smaller and smaller, the need for highly precise wafer handling components grows. The difficulty in achieving the required precision also grows. For instance, the silicon wafers upon which are to be manufactured the microprocessor chips must be precisely placed in the processing machines. The wafers typically are handled by vacuum handling equipment. The wafers droop, ever-so-slightly under their own weight. When lowered to a wafer chuck, the drooping wafer "wants" to flatten out, but may be hindered from doing so by friction between the wafer and chuck. This is sometimes referred to as a "stickiness" problem. Metal oxides are notable in this regard, and silicon dioxide is no exception. Among the efforts to solve, or, at least ameliorate, this problem, have been to minimize the contact area between the wafer and the chuck. This particular engineering solution may take the form of designing a plurality of "plateaus" of uniform height, typically regularly spaced, into the wafer. These plateaus exist in many geometries, and go by many names including pins, burls, mesas, bumps, proud lands, proud rings, etc. The pins help in reducing the friction so that the wafer can move laterally across the pins as it flattens out upon settling on the pins. The pins help to reduce wafer sticking, but further improvements in this regard are needed.

It is critical that wafers lie flat against the support surface(s) of the chuck. Otherwise, the circuit pattern images that are projected onto the wafer may be out-of-focus. Furthermore, wafer lithography may involve multiple exposures, with re-location of the wafer between exposures. Thus, it is critical that there be a way to precisely re-align the wafer on the chuck relative to its first positioning so that the subsequent exposures will take place in the correct position on the wafer.

Wafer Contamination and Wafer Landing

Why are wafers not flat to begin with? When wafers are processed and by inherent limitations of the manufacture they are not flat. Often, processes performed in the front end semiconductor line add films to the wafer, which results in more or less curved wafers. This curvature can be any direction, upward or downwards. The majority of the departure from flat is in curvature and deformation is as a sphere and or cylindrical shape.

Additionally, wafer chucks are never perfectly flat and often have a slight curvature in a random manner, such as orientations that are upwards (bowl) or downwards (dome) in shape. FIG. 1 shows the various possibilities between the wafer and chuck for orientations that are flat, curved up, or curved down.

When wafers are located on the wafer chuck that have picked up a curvature due to normal process, they are required to return to the original clamping location by settling to flat. As discussed earlier, the wafer is required to relax in a manner that is predominately radial.

In semiconductor lithography, often there is a need for multiple exposures, but with the wafer being moved between exposures. When a shape mismatch occurs between the wafer and chuck, the wafer needs to slide and relax a very small amount to realign with a previously generated pattern. If the wafer chuck roughness is in such a manner that the wafer is unable to relax to the natural state (by sliding), then a second or subsequent pattern is misaligned; hence overlay becomes compromised.

The friction between two opposing and contacting surfaces depends not only on the roughness of the surfaces, but also on the contour or "shape" or topography of the roughness. For example, if the roughness has a directionality, the friction likely will also possess a directionality.

This is demonstrated below in FIG. 2, with three graphs presented by Bharat Bhushan in his paper entitled, "Micro/Nanotribology and Micro-Nanomechanics of Magnetic Storage Devices", which is found between pages 1137 and 1197 in the reference book, *Nanotribology and Nanomechanics,* published by Springer Berlin Heidelberg in 2008. The top or (a) plot is a profilometer trace of surface roughness for aligned grooves (a "ruling"). The second (b) plot shows the slope of the surface roughness of the first plot. The third (c) plot is a map of friction force. The second and third plots show that friction force is proportional to the slope of the roughness. The top graph shows that friction will be least where a contacting surface is moving front-to-back (along axis 21), will be greater when the contacting surface is moving right-to-left (along axis 23), and will be greatest when the contacting surface is moving left-to-right (along axis 25), due to the directionality and asymmetry of the roughness in the bottom surface.

The current designs are limited in that as the surface area is reduced by making more and more scratches, under this condition the wafer chuck becomes more susceptible to wear due to the higher localized pressure and reduced bearing area. The rougher the surface, the greater the likelihood of increased wear.

The instant invention addresses these issues, and provides a solution.

DISCLOSURE OF THE INVENTION

Grinding, lapping and polishing basically work by making scratches in the body being ground, lapped or polished. The scratches typically are linear. The scratches gives rise to a directionality component of friction: the friction coefficient is less in the direction along the scratch than in a direction orthogonal, or across, the scratch.

In a wafer handling/chucking situation, one wants the wafer to settle on the chuck, which involves the outer regions of the wafer moving radially with respect to the chuck. One can reduce friction in the radial direction by giving the lapping scratches a preferred orientation, namely, radial. This can be achieved by making the final passes of the lapping tool move predominantly in radial directions.

BRIEF DESCRIPTION OF THE DRAWINGS

FIG. 5 showing slope plots indicating that the surface was more or less randomly scratched in the region where contact is made with the wafer. Specifically.

FIG. 7 shows the slope plot corresponding to the pin of FIG. 6. Specifically.

FIG. 8 shows the generation of radial scratches to minimize the roughness along the settling direction of the wafer. Specifically.

MODES FOR CARRYING OUT THE INVENTION

Grinding, lapping and polishing basically work by making scratches in the body being ground, lapped or polished. The scratches typically are linear. The scratches gives rise to a directionality component of friction: the friction coefficient is less in the direction along the scratch than in a direction orthogonal, or across, the scratch.

Current techniques for lapping wafer chucks use a randomly generated roughness in a 'bearing' geometry (plateau) whereby the top contact region is minimized and the top surface roughness, commonly identified as "Spq", is maximized. This technique recognizes that the forces required to overcome the friction are proportional to the slope of the roughness. Steeper slopes generate more resistance to sliding.

Figure 1A:
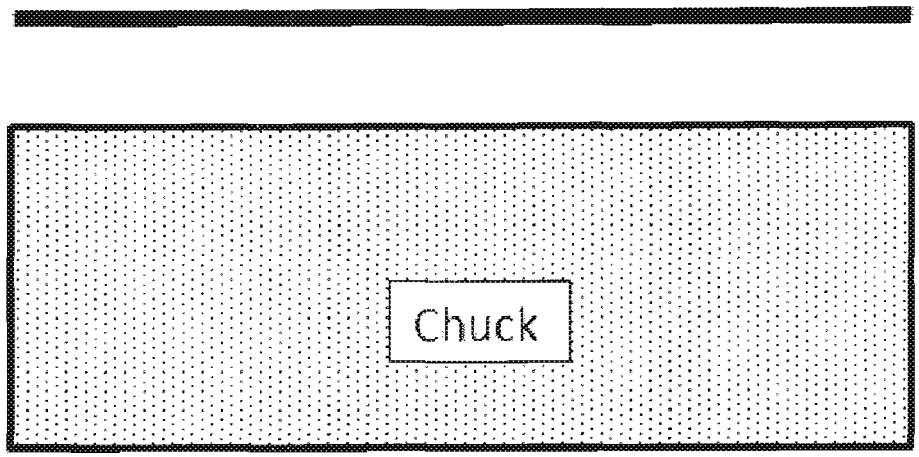
FIGS. 1A-1H shows various possibilities between the wafer and chuck for orientations that are flat, curved up, or curved down.
Figure 1B:
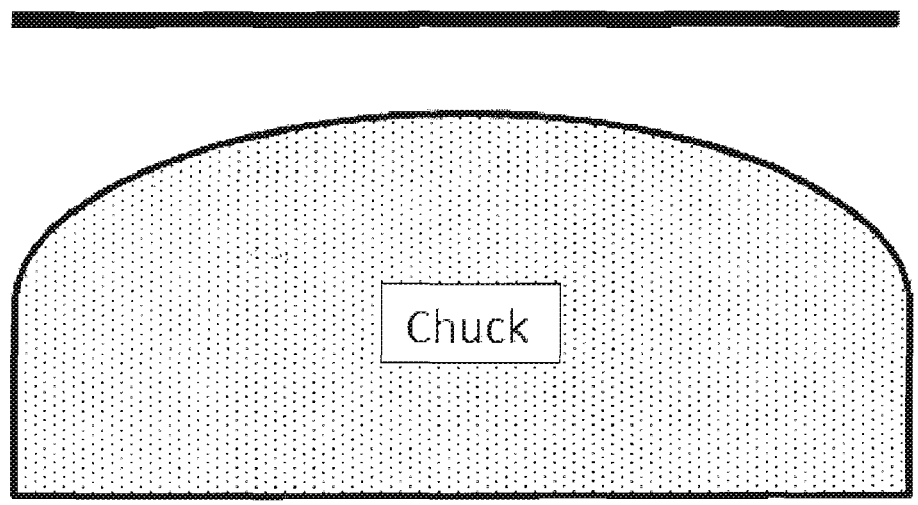
Figure 1C:
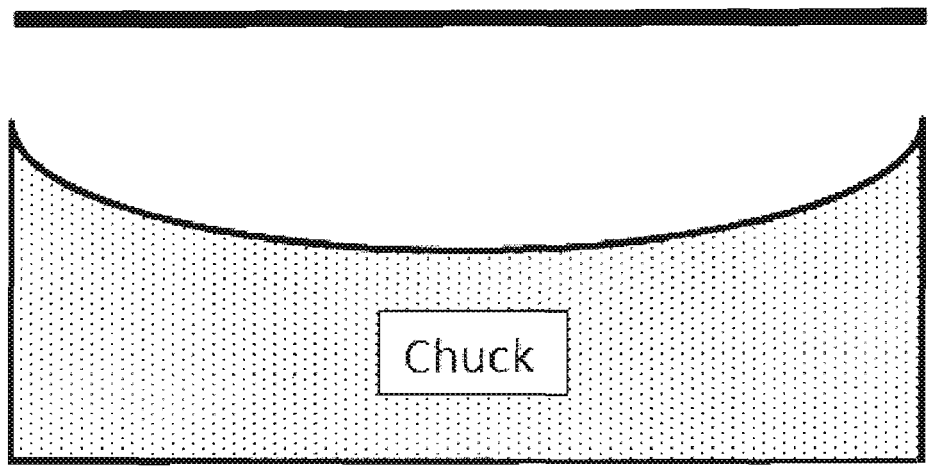
Figure 1D:
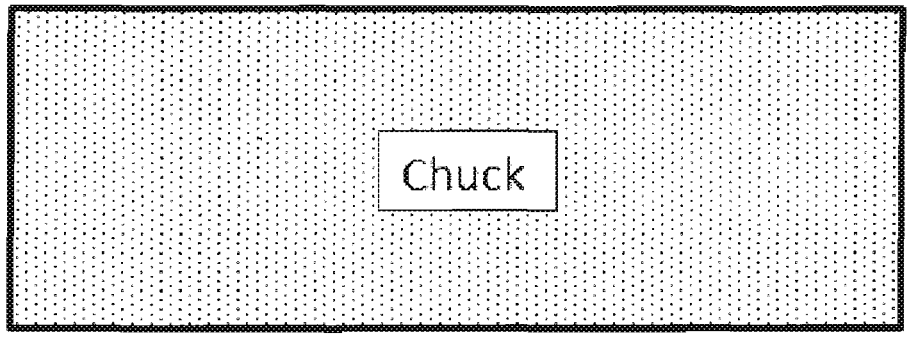
Figure 1E:
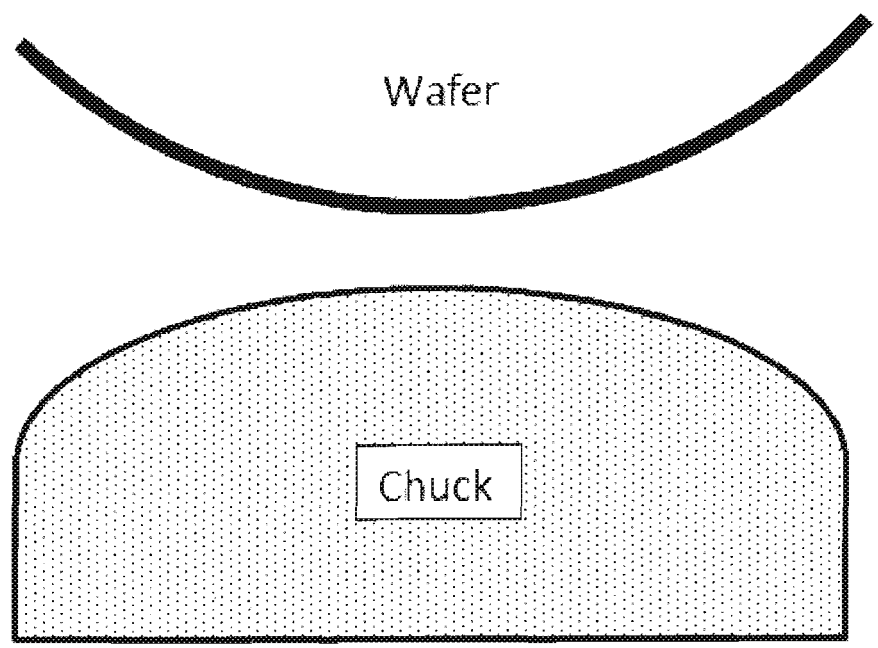
Figure 1F:
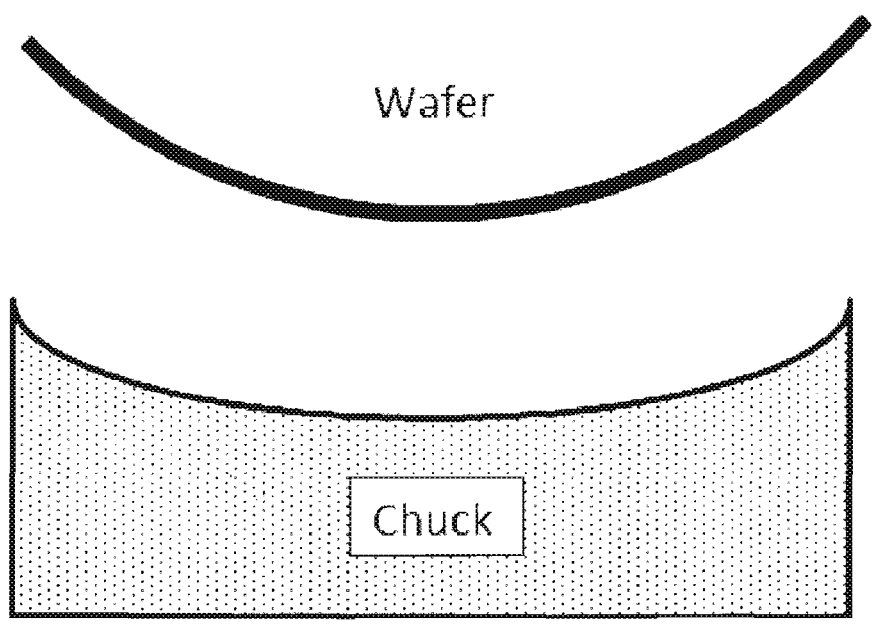
Figure 1G:
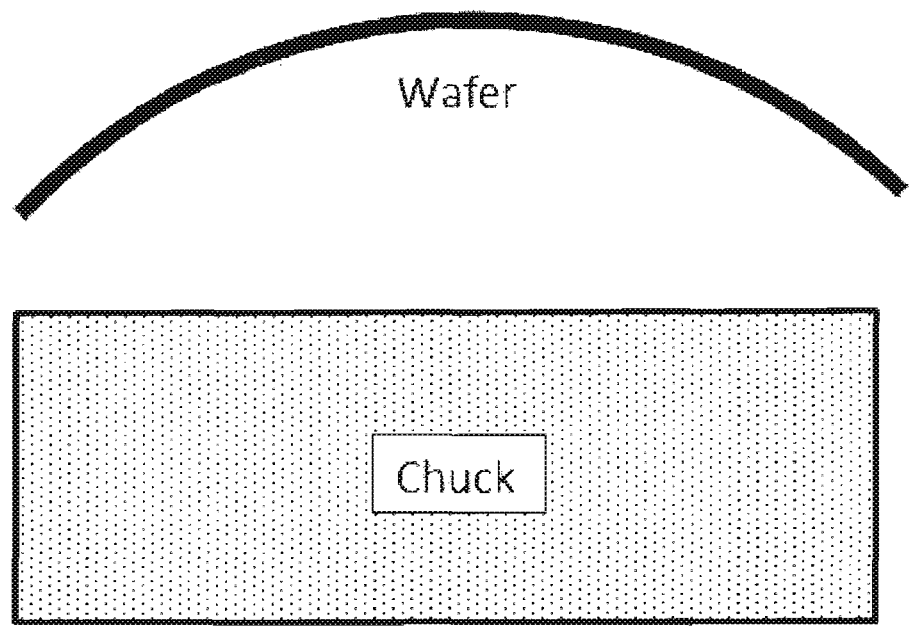
Figure 1H:
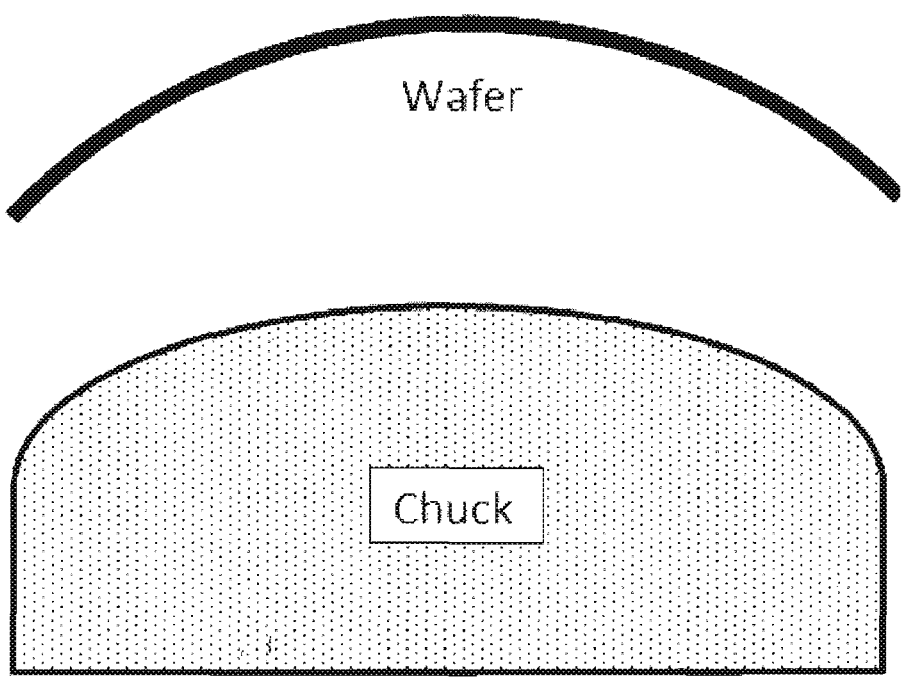
Figure 2:
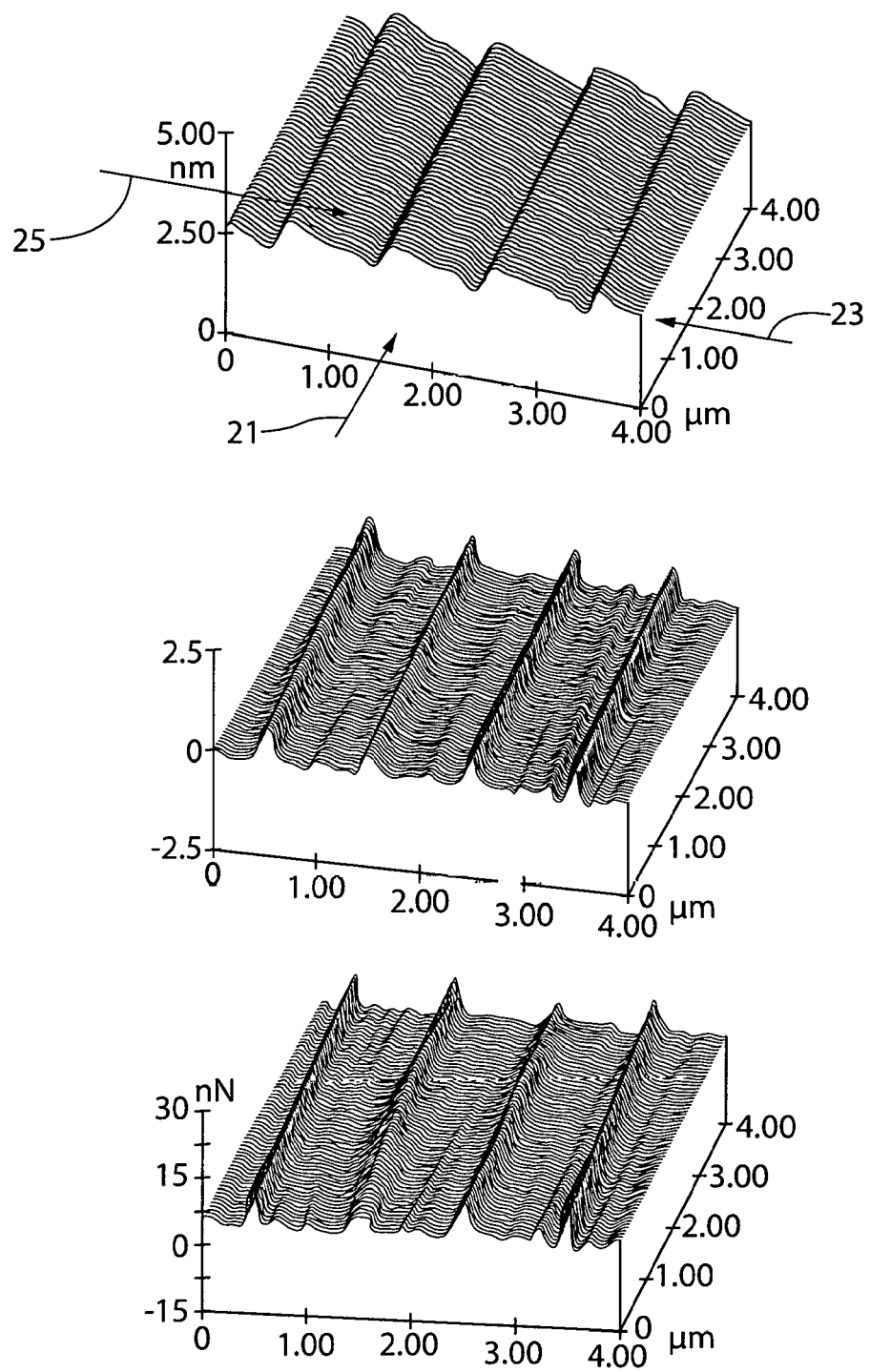
FIG. 2: (a) surface roughness map, (b) slope of the roughness profile taken in the sample sliding direction (the horizontal axis), and (c) friction force map for a gold-coated ruling at a normal load of 155 nN.
Figure 3:
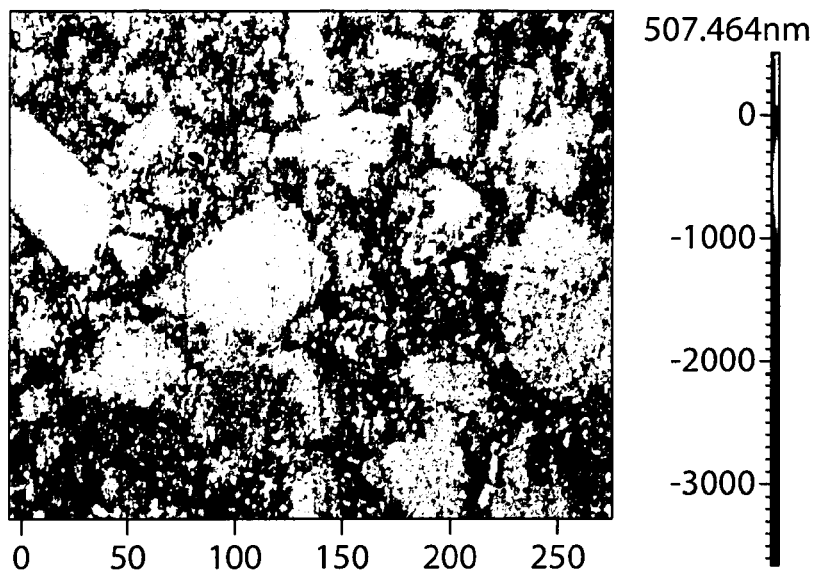
FIG. 3: Typical pin surface showing residual scratches from the manufacturing process.
Figure 4:
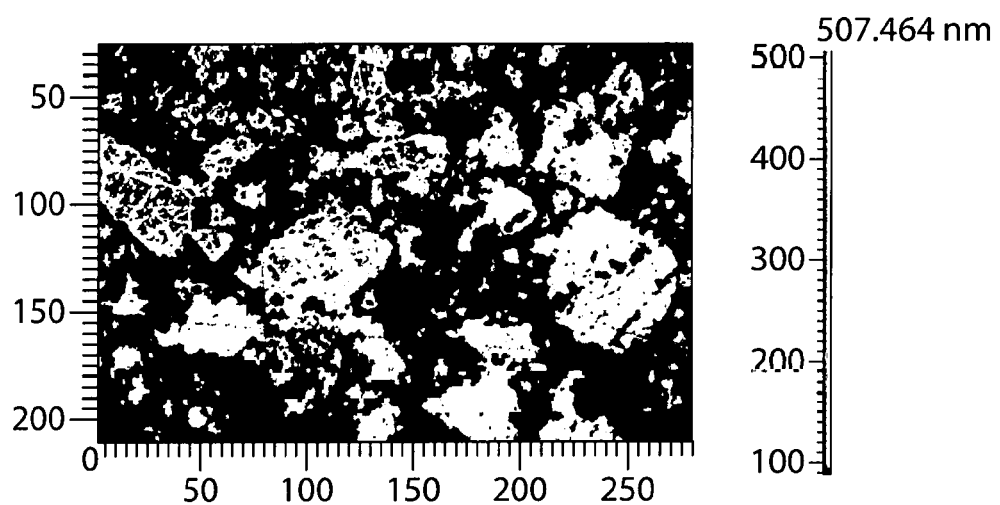
FIG. 4: This shows the surface that is to be in contact with the wafer.
Figure 5A:
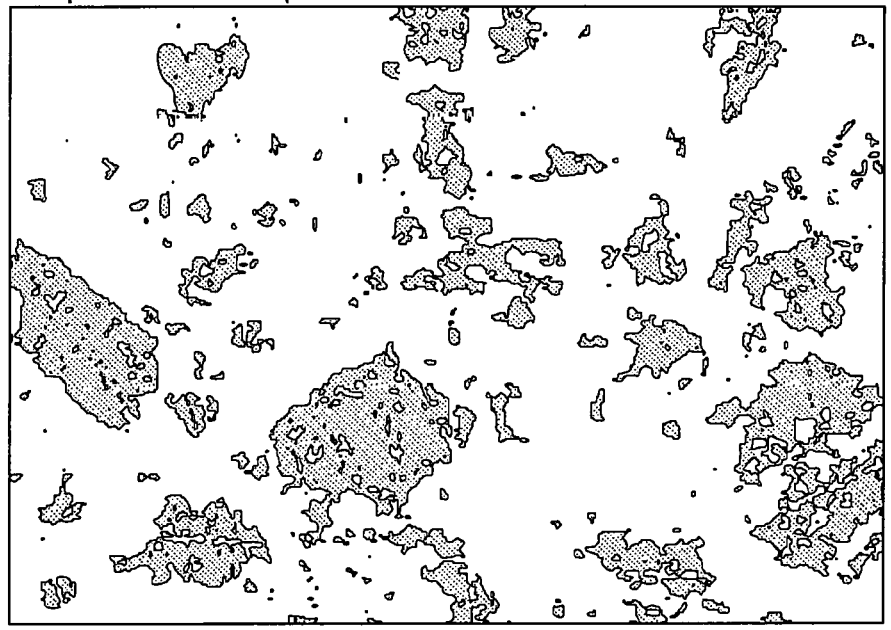
FIGS. 5A and 5B are image and histogram corresponding to slope in the X direction.
Figure 5B:
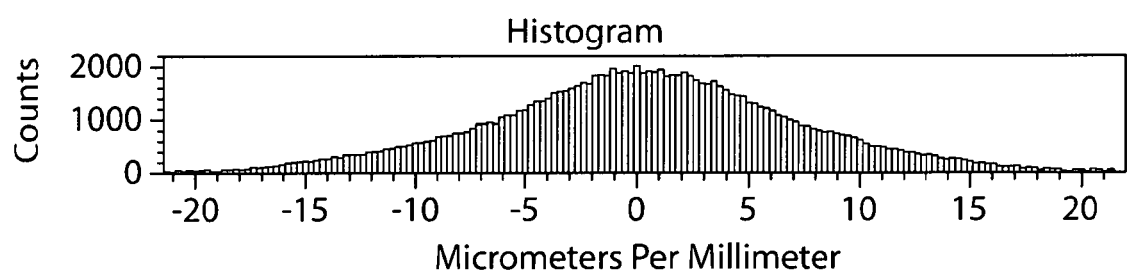
Figure 5C:
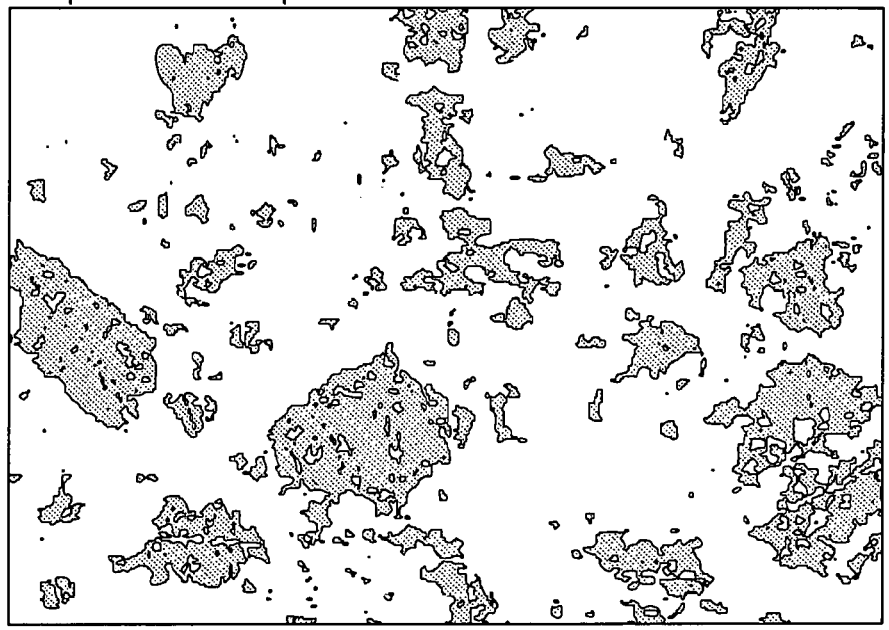
FIGS. 5C and 5D are image and histogram corresponding to slope in the Y direction.
Figure 5D:
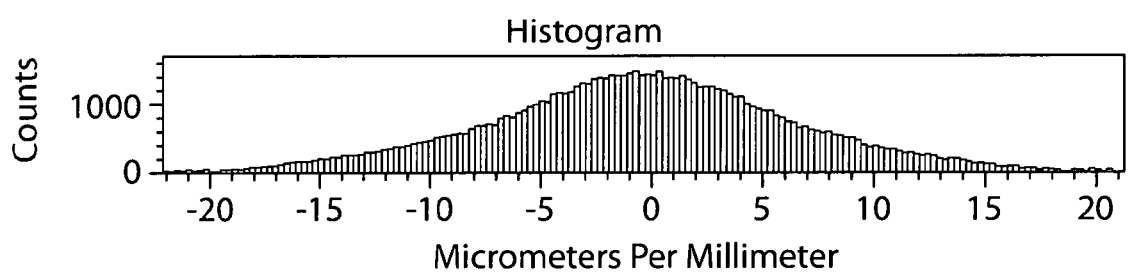

A typical pin's bearing surface is fabricated by methods such as grinding, lapping or polishing, which intentionally generate random scratches in the surface where the wafer is in contact. These scratches in the surface are aligned in a more or less random manner; therefore, there is no preferential direction with less friction. A typical lapped pin is shown below in FIG. 3. When the data are clipped to show just the bearing surface where the wafer contacts the wafer chuck, the randomness of the scratching is more evident as shown in FIG. 4. Figure Cartesian space and the slope in the X and Y orthogonal directions is plotted.

The tool here used to accomplish lapping is termed a "treatment tool". In one embodiment, the treatment tool may have about the same hardness as the chuck, or at least the chuck surface that supports a wafer. One way to accomplish this is to fabricate the treatment tool from the same, or similar material as used to fabricate the chuck or chuck support surface. A popular choice in such materials is a ceramic such as silicon carbide (SiC), which may be in the form of a SiC-containing composite material such as reaction bonded SiC ("RB-SiC").

The treatment tool typically features a flat surface (or one that appears flat visually) that is intended to mechanically or physically contact the surface of the work piece, for example, a wafer chuck. In another embodiment, the treatment tool may be shaped as a ring or annulus. The tool is moved over the chuck surface while in physical contact with it, thus removing material by abrasion.

In one embodiment, the treatment tool is 27 mm in diameter. Visually, the contact surface appears to be a flat disc, but in reality it has a slight toroidal shape so that when it is brought into contact with the flat surface, the area of contact is not that of a disc but instead is a circle or annulus. If the contacting surface of the treatment tool is shaped as an annulus or ring, it, too, may feature a slightly toroidal shape.

A wafer surface is populated with dies, or regions where a microprocessor will be formed by lithography. The size of a die may range from about 3 millimeters to about 28 millimeters. The size, diameter, or "effective diameter" of the treatment tool may be scaled to correspond to the die size on the wafer that is to undergo lithography. Thus, where the die size is 28 mm long, a 28 mm diameter lapping tool would be appropriate.

The lapping that was carried out according to the instant invention made use of a 28 millimeter toroidal-shaped SiC-containing treatment tool under a dead weight load of about 180 grams, and operated at an average velocity of about 3 meters per minute. Visually, the treatment tool appeared disc-shaped; however, the edge and center regions of the disc were elevated away from flat to give the treatment tool a slightly toroidal shape.

FIG. 5. features histograms showing the slope of the surface roughness in X (FIGS. 5B) and Y (FIGS. 5D) directions. The images (FIGS. 5A and 5C) above each histogram (FIGS. 5B and 5D) are photomicrographs of the surfaces where the surface roughness was measured. The RMS slope of surface roughness in the X-direction was 7.22 microns per millimeter. The RMS slope of surface roughness in the Y-direction, orthogonal to the X-direction, was 7.24 microns per millimeter. Thus, the slopes are about the same, indicating a lack of directionality to the surface roughness.

Figure 6:
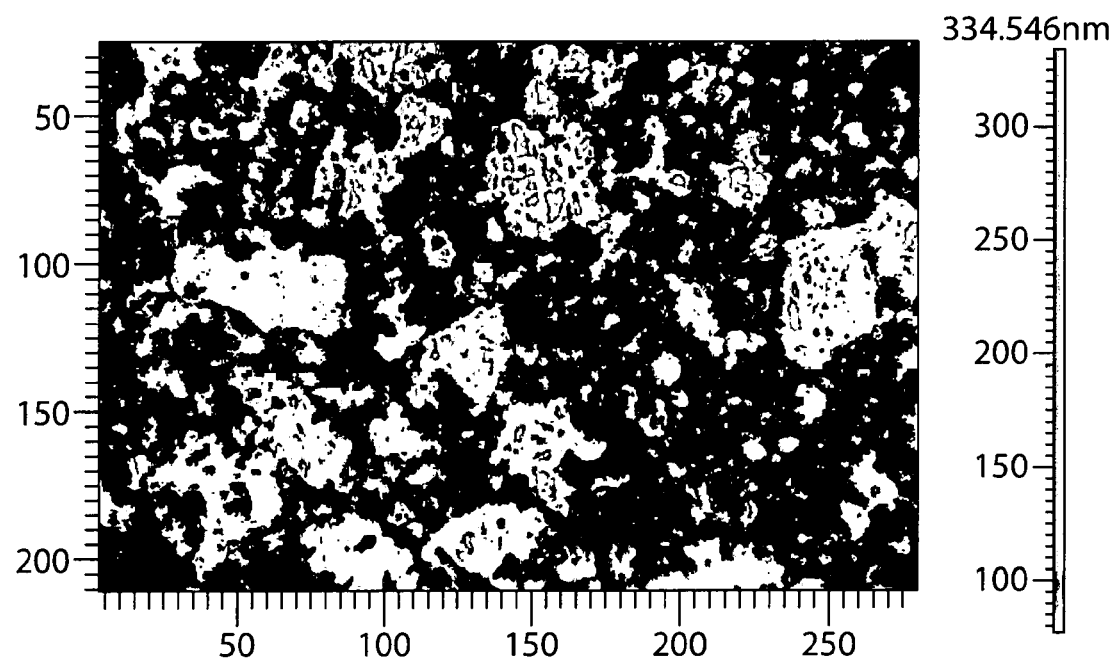
FIG. 6 shows a pin surface that has been final lapped along the Y-axis.

Next, the movement of the treatment tool was modified to see if the tool could impart a directionality to the surface roughness. Specifically, the final strokes or passes of the treatment tool were made along a specific axis, namely, the Y-axis. Certainly, the scratches imparted by the tool have a directionality, as seen in the photomicrograph that is FIG. 6.

Figure 7A:
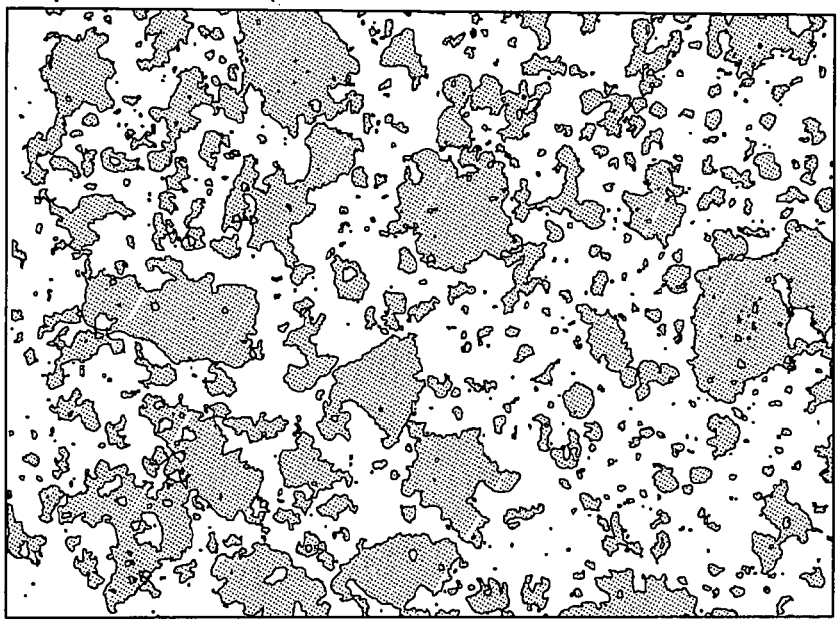
FIGS. 7A and 7B are image and histogram corresponding to slope in the X direction.
Figure 7B:
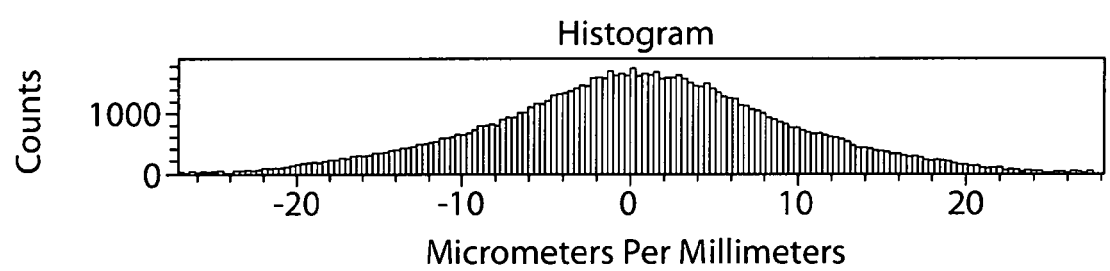
Figure 7C:
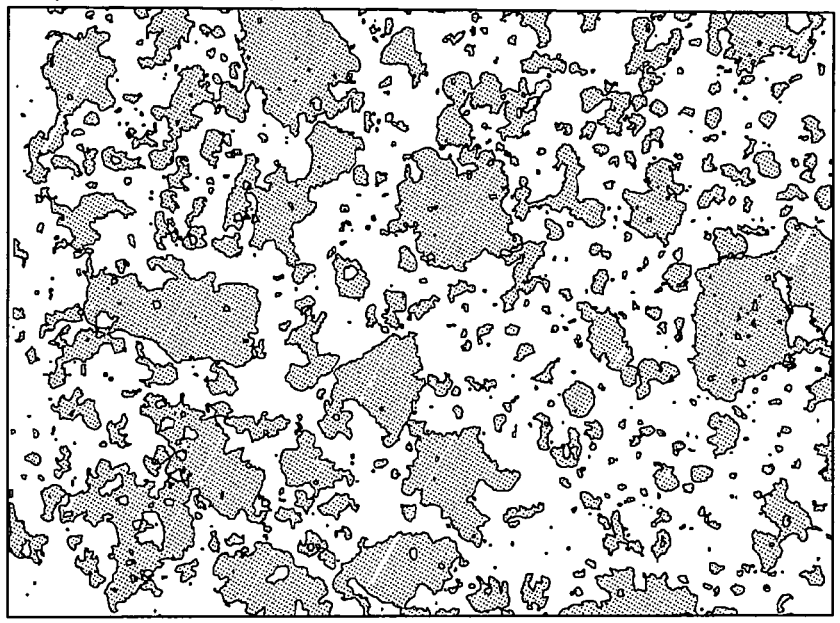
FIGS. 7C and 7D are image and histogram corresponding to slope in the Y direction.
Figure 7D:
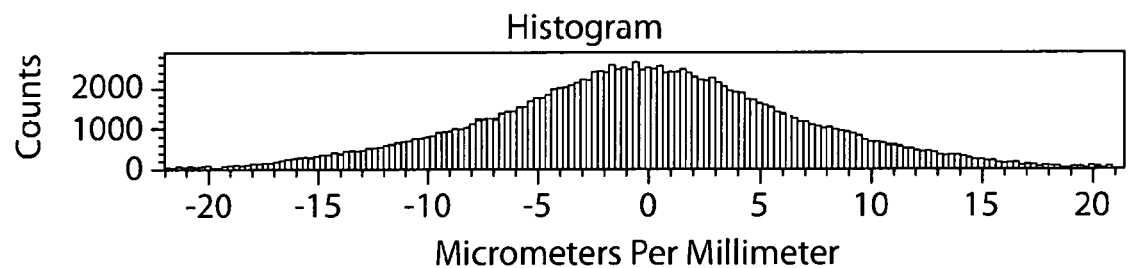

FIGS. 7A-7D further document and quantify this directionality. Again, FIGS. 7A and 7C are optical photomicrographs corresponding to the histograms of FIGS. 7B and 7D. The histograms report the distribution of slopes of the surface elevation. At an RMS of 7.26 microns per millimeter, the slope in the Y-direction, along the direction of lapping, was about the same as before, for the randomized lapping situation. Significantly, the RMS slope in the X-direction, orthogonal to the Y-direction, was much higher, at 9.26 microns per millimeter. Since frictional force is proportional to the slope of the elevation, the friction in the X-direction is expected to be greater than the friction in the Y-direction.

Figure 8A:
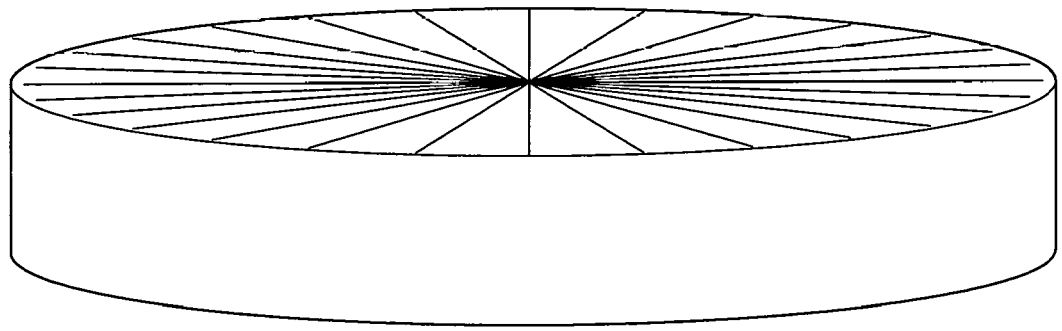
FIG. 8A is a perspective view.
Figure 8B:
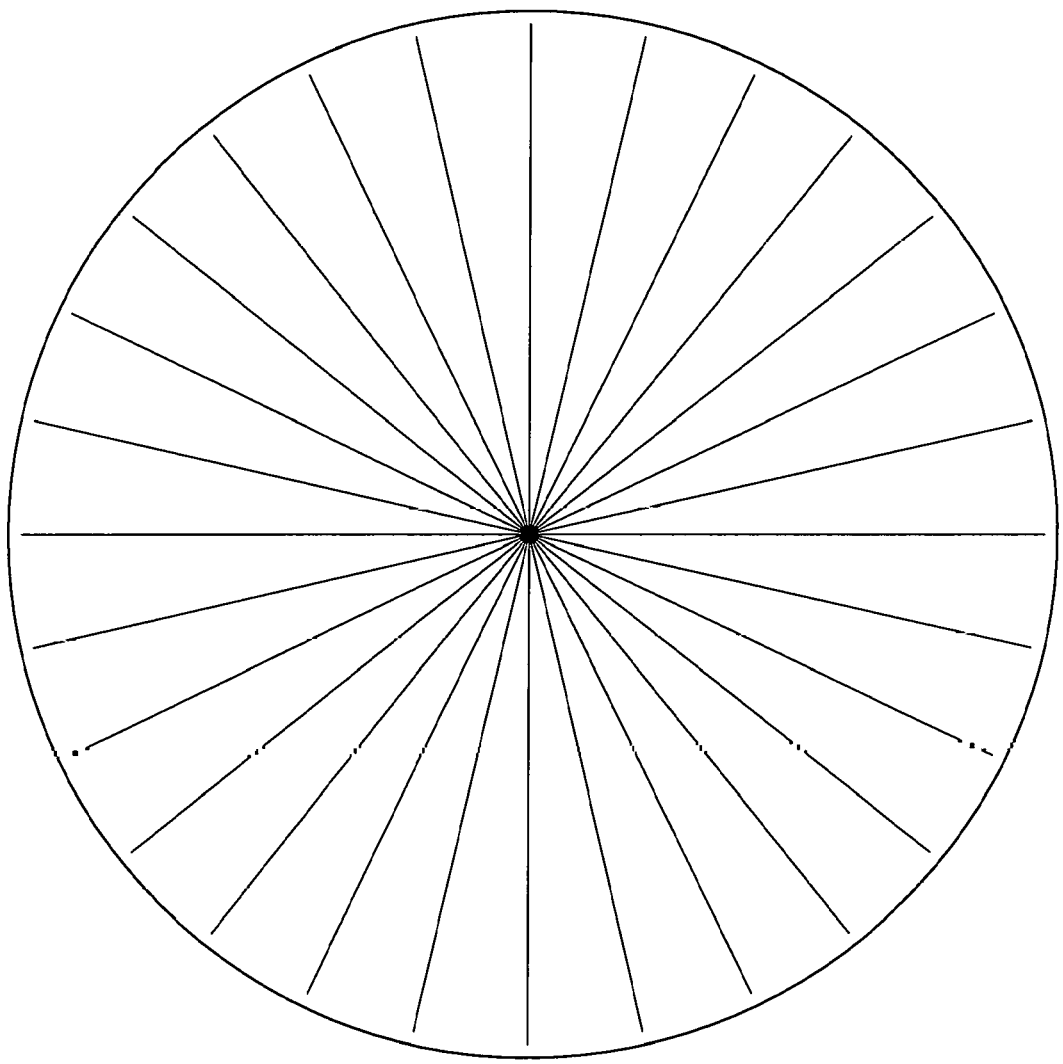
FIG. 8B is a top or plan view of the radial scratches in a wafer chuck.

A method to generate the features is by traveling across the wafer chuck through the center, as shown in FIG. 8. This may take compensation by changing the velocity and or the pressure to minimize the variation in the radial direction of the material that is removed.

If the treatment tool is constrained such that it cannot pass through the center of a wafer chuck, then an alternate means to generate scratches that are very nearly radial is to have the final passes of the treatment tool describe a multi-pointed star pattern, with the next point of the star to be formed immediately after its adjacent star point. In other words, the treatment tool in its final passes, takes a zig-zag path along the circumference of the wafer chuck, with the zigs and zags being toward and away from the center. In this way, the scratches formed by the treatment tool in its final passes will be close to radial directions.

SUMMARY AND CONCLUSIONS

The results of the lapping tests corresponding to FIGS. 5A through 7D indicate that a directionality can be imparted to the lapping process, that the slope of the surface elevation or surface roughness can be engineered and specifically, can be given a directionality. The results also suggest that the forces required to overcome friction between two surfaces can be given a directionality, and specifically suggest that the friction force orthogonal to the lapping direction will be greater than the friction force parallel to the lapping direction. Since wafers settling on a wafer chuck need to "relax" radially (that is, in radial directions), this suggests the lapping, or at least the final strokes of a lapping operation, should take place in radial directions along the wafer chuck support surface.

This design solves the stickiness problem by making small marks (e.g., scratches) on the bearing surface in a direction such that the surface is less restrictive and allows the wafer to relax.

The preferred method to generate these scratches is a with a small tool lap, this lap can be more or less annular in shape to conformally "float" over the surface, thus minimally impacting gross curvature. One technique for accomplishing this behavior is to arrange that the treatment tool be minimally constrained in its attachment to its holder in the lapping machine, for example, by means of a ball-and-socket joint.

When a surface is treated with a tool in a final lap along a specific axis, the roughness becomes larger in the slope of the opposing axis.

What is proposed is a design whereby the slope of the interface surface between the wafer chuck and the wafer, along the direction of sliding is minimal (for a wafer chuck this is radial) yet the area remains constant, thus maintaining a nominal resistance to wear.

INDUSTRIAL APPLICABILITY

The instant invention can be used in new wafer chucks that have not yet been placed in service. It can be used to repair wafer chucks that have already seen service. Furthermore, the repair of wafer chucks can take place in-situ; that is, without having to remove the wafer chuck from the lithography machine.

Although much of the forgoing discussion has focused on articles and devices for chucking semiconductor wafers, one of ordinary skill in the art will recognize other related applications where the techniques and articles disclosed in the instant patent application will be useful, for example, in other fields and industries where one desires to engineer a low friction surface, or to engineer a surface whose friction is anisotropic, that is, direction-dependent.

An artisan of ordinary skill will appreciate that various modifications may be made to the invention herein described without departing from the scope or spirit of the invention as defined in the appended claims.

What is claimed is:

1. A wafer chuck for supporting a semiconductor wafer, comprising a surface configured to support the semiconductor wafer, said surface (i) inducting a plurality of regularly spaced pins of uniform height, thereby preventing drooping of the semiconductor wafer upon lowering of the semiconductor wafer onto said support surface, (ii) having a lower coefficient of friction in a radial direction than in a circumferential direction, and (iii) comprising scratches in a bearing surface of said pins, said scratches oriented predominantly radially.

2. The wafer chuck of claim 1, produced by a lapping tool having about the same hardness as said wafer chuck.

3. The wafer chuck of claim 1, produced by a lapping tool comprising SiC.

4. The wafer chuck of claim 1, produced by a lapping tool having a toroidal shape.

5. The wafer chick of claim 4, wherein said lapping tool has a diameter of about 28 millimeters, and applies a load of about 180 grams to said wafer chuck.

6. The wafer chuck of claim 5, wherein said lapping tool is moved over said wafer chuck at a velocity of about 3 meters per minute.

7. The wafer chuck of claim 1, wherein said support surface comprises SiC.

8. The wafer chuck of claim 1, wherein said support surface comprises reaction bonded: silicon carbide.

9. The wafer chuck of claim 1, wherein said predominantly radially oriented scratches are produced by a lapping tool comprising reaction bonded silicon carbide.

10. A wafer chuck for supporting a semiconductor wafer, comprising a surface configured to support the semiconductor wafer, said surface (i) having a center, (ii) featuring abrasion scratches that are oriented radially and pass through said center of said surface, and (iii) having a lower coefficient of friction in a direction along said radially oriented scratches than in a direction across said radially oriented scratches.

* * * * *